United States Patent
Zeile et al.

(10) Patent No.: US 8,487,270 B2
(45) Date of Patent: *Jul. 16, 2013

(54) PARTICLE BEAM DEVICE AND METHOD FOR USE IN A PARTICLE BEAM DEVICE

(75) Inventors: Ulrike Zeile, Heidenheim (DE); Andreas Schertel, Aalen (DE)

(73) Assignee: Carl Zeiss Microscopy GmbH, Jena (DE)

( * ) Notice: Subject to any disclaimer, the term of this patent is extended or adjusted under 35 U.S.C. 154(b) by 0 days.

This patent is subject to a terminal disclaimer.

(21) Appl. No.: 13/589,461

(22) Filed: Aug. 20, 2012

(65) Prior Publication Data

US 2012/0305765 A1 Dec. 6, 2012

Related U.S. Application Data

(63) Continuation of application No. 12/156,954, filed on Jun. 5, 2008, now Pat. No. 8,247,785.

(30) Foreign Application Priority Data

Jun. 6, 2007 (DE) .................. 10 2007 026 847

(51) Int. Cl.
*H01J 37/26* (2006.01)
(52) U.S. Cl.
USPC .............. 250/442.11; 250/440.11; 250/491.1; 250/310; 250/311
(58) Field of Classification Search
USPC .................. 250/306, 307, 309, 310, 440.11, 250/442.11, 492.1, 492.3
See application file for complete search history.

(56) References Cited

U.S. PATENT DOCUMENTS

| 7,015,483 | B2 | 3/2006 | Suzuki et al. |
| 7,518,125 | B2 | 4/2009 | Yamamoto et al. |
| 7,718,981 | B2 | 5/2010 | Takahashi et al. |
| 8,247,785 | B2 * | 8/2012 | Zeile et al. ............... 250/442.11 |
| 2005/0103997 | A1 | 5/2005 | Muller |
| 2005/0199828 | A1* | 9/2005 | Tokuda et al. ............ 250/492.3 |
| 2006/0163478 | A1 | 7/2006 | Jaksch et al. |
| 2007/0045560 | A1 | 3/2007 | Takahashi et al. |

FOREIGN PATENT DOCUMENTS

| EP | 1 780 764 A1 | 5/2007 |
| JP | 2005-005108 A | 1/2005 |
| JP | 2005-044817 A | 2/2005 |
| JP | 2005-100988 A | 4/2005 |
| JP | 2005-285776 A | 10/2005 |
| JP | 2006-194907 A | 7/2006 |
| JP | 2007-053048 A | 3/2007 |
| JP | 2007-066710 A | 3/2007 |
| JP | 2007-129214 A | 5/2007 |
| JP | 2007-164992 A | 6/2007 |
| WO | WO 2005/006384 A2 | 1/2005 |

* cited by examiner

Primary Examiner — Nicole Ippolito
(74) Attorney, Agent, or Firm — Muirhead and Saturnelli, LLC

(57) ABSTRACT

A particle beam device includes a movable carrier element with at least one receiving element for receiving a specimen and in which the receiving element is situated on the carrier element. In various embodiments, the receiving element may be situated removably on the carrier element and/or multiple receiving elements may be situated on the carrier element in such a way that a movement of the carrier element causes a movement of the multiple receiving elements in the same spatial direction or around the same axis. The carrier element may be movable in three spatial directions situated perpendicular to one another and rotatable around a first axis which is parallel to an optical axis of the particle beam device and around a second axis which is situated perpendicular to the optical axis. A method for using the particle beam device in connection with specimen study and preparation is also disclosed.

11 Claims, 16 Drawing Sheets

PARTICLE BEAM DEVICE AND METHOD FOR USE IN A PARTICLE BEAM DEVICE

RELATED APPLICATIONS

This application is a continuation of U.S. application Ser. No. 12/156,954, filed Jun. 5, 2008, now U.S. Pat. No. 8,247,785, which is hereby incorporated by reference.

TECHNICAL FIELD

This application relates to a particle beam device and a method for use in a particle beam device, in which a specimen is situated on a carrier element. This application also relates to a carrier element having a specimen receiving element.

BACKGROUND OF THE INVENTION

Particle beam devices, such as electron beam devices, have been used for some time for studying objects (specimens). In particular, scanning electron microscopes and transmission electron microscopes are known. In a scanning electron microscope, an electron beam generated using a beam generator is focused through an objective lens on the object to be studied. Using a deflection device, the electron beam (also referred to as the primary electron beam hereafter) is scanned over the surface of the object to be studied. The electrons of the primary electron beam interact with the object. As a result of the interaction, in particular electrons are emitted from the object (so-called secondary electrons) or electrons of the primary electron beam are scattered back (so-called backscattered electrons). Secondary and backscattered electrons form the so-called secondary beam and are detected using a detector. The detector signal generated in this way is used for image generation.

Furthermore, equipping a scanning electron microscope with an ion column is known. Ions are generated using an ion beam generator situated in the ion column, which are used for the preparation of objects (such as polishing an object or applying material to an object) or also for imaging.

A further known device for the preparation of an object (specimen) in a particle beam device using a particle beam is described hereafter. Using this further known device, a second specimen is extracted from a first specimen, which is situated in a vacuum chamber on a specimen table, and fastened to a specimen holder, which is also situated on the specimen table. The specimen holder is discharged from the vacuum chamber for further study of the second specimen. This is disadvantageous for many applications, because the discharge of the specimen holder requires a long time on the one hand and, on the other hand, the danger exists that the second specimen may be contaminated.

Furthermore, a device and a method for specimen preparation having the following features or method steps are known from the related art. A specimen is situated on a specimen table of a manipulator in a vacuum chamber in a particle beam device. In a first position of the manipulator, a piece is cut out of the specimen using an ion beam and this cutout piece is fastened to a specimen holder which is situated on the manipulator. The manipulator is brought by a linear movement into a second position, in which an electron beam is focused on this piece for further study. Electrons passing through this piece are detected using a detector. However, this known device has the disadvantage that it has quite a complex construction.

Reference is made to DE 103 51 276 A1, U.S. Pat. No. 6,963,068, and EP 0 927 880 A1 in regard to the above-mentioned related art.

Accordingly, it would be desirable to provide a particle beam device and a carrier element having a receiving element as well as a method for specimen preparation and/or specimen study usable in the particle beam device, the device being constructed simply and the method not being very time-consuming.

SUMMARY OF THE INVENTION

According to the system described herein, a particle beam device has at least one particle beam column which is provided with an optical axis. Furthermore, the particle beam device is provided with at least one carrier element which is movable in three spatial directions situated perpendicular to one another. Furthermore, the carrier element is designed to be rotatable around a first axis which is situated parallel to the optical axis or corresponds to the optical axis, and around a second axis which is situated perpendicular to the optical axis. The particle beam device additionally has at least one first receiving element for receiving a first specimen and at least one second receiving element for receiving a second specimen. Both the first receiving element and also the second receiving element are situated on the carrier element in such a way that a movement of the carrier element always causes a movement of the first receiving element and the second receiving element in the same spatial direction and/or around the same axis. Furthermore, it is provided that the carrier element is movable into at least one first position and into at least one second position, a first specimen being able to be irradiated in the first receiving element in the first position using a particle beam, and a second specimen being able to be irradiated in the second receiving element in the second position using a particle beam. The first receiving element may have a first receptacle axis, while the second receiving element may have a second receptacle axis. The first receptacle axis and the second receptacle axis may be situated offset to one another by an angle in the range of 10° to 90° (and more specifically in a range of 20° to 90°). This may also be described as follows. The first receiving element may have a first receiving surface, which lies in a first plane, while the second receiving element may have a second receiving surface which lies in a second plane. The first plane may be situated offset to the second plane by an angle in the range of 10° to 90° (more specifically 20° to 90°).

A further particle beam device according to the system described herein is provided with at least one particle beam column for providing a particle beam which has an optical axis. Furthermore, at least one carrier element and at least one receiving element for receiving a specimen are provided on the particle beam device, the receiving element being removably connected to the carrier element. The receiving element may be brought into at least one position, by removal from the carrier element and subsequent connection to the carrier element, in which a specimen may be irradiated using a particle beam.

The system described herein is based in particular on the idea that components already present in a particle beam device, in particular a specimen table designed as a carrier element and situated in such a way that it is movable, are usable for simplifying a device for specimen study and/or specimen preparation. In both particle beam devices described above, a specimen does not have to be discharged from a vacuum chamber for further study. In particular if two receiving elements are arranged, it is possible to extract a second specimen from a first specimen, and to prepare and study the second specimen, without the second specimen having to be discharged from a vacuum chamber. Furthermore, because of the configuration of the two receiving elements on the carrier element, simple and well-controllable movement sequences are possible. The entire process described above is executable completely automatically using a suitable controller. This is also true for the particle beam device according to the system described herein, in which, by the removal and subsequent reconnection of the receiving element, the receiving element may be brought into a position in which a specimen may be irradiated using a particle beam. The system described herein also has the advantage that the receiving element(s) do/does not have to have any movement mechanisms, because all required movements may be implemented via the degrees of freedom of the carrier element (e.g., a specimen table). The carrier element having the receiving element(s) is also particularly well suitable for discharging a specimen out of the particle beam device (for example, a specimen prepared in the particle beam device). Additionally or alternatively thereto, the carrier element having the receiving element(s) is particularly well suitable for inserting a pre-prepared specimen into the particle beam device.

In an embodiment of the particle beam device, in which the receiving element is positioned by removal from the carrier element and subsequent connection to the carrier element, the receiving element may be brought from a first position by removal from the carrier element into a second position by subsequent connection to the carrier element. Furthermore, the receiving element has a receptacle axis, the receptacle axis in the first position and the receptacle axis in the second position being situated offset to one another by an angle. This angle may be in a range of 20° to 160°, particularly at 90°.

In a further embodiment of the particle beam device in which the receiving element may be brought into such a position, by removal from the carrier element and subsequent connection to the carrier element, in which a specimen may be irradiated using a particle beam device, the carrier element may be designed to be movable in three spatial directions situated perpendicular to one another. Furthermore, it is designed to be rotatable around a first axis which is situated parallel to the optical axis or corresponds to the optical axis, and around a second axis, which is situated perpendicular to the optical axis.

In the above-mentioned particle beam device according to the system described herein, in an embodiment, the carrier element may have at least one first guide element and the receiving element has at least one second guide element, the first guide element and the second guide element being designed as complementary to one another. For example, the first guide element is designed as a dovetail-shaped projection, while the second guide element is correspondingly designed as a complementary recess. In a further embodiment, the second guide element is implemented as a dovetail-shaped projection, and the first guide element is correspondingly implemented as a complementary recess. The system described herein is not restricted to a single first guide element or a single second guide element. Rather, embodiments are certainly also provided which have more than one single first guide element and more than one single second guide element. The above-mentioned guide elements are used for situating the receiving element on the first or second position and accordingly ensure the angularly offset configuration, which was described above.

In a further embodiment of the above-mentioned particle beam device, the receiving element has a movement device with which the receiving element may be brought into the at least one position in which a specimen may be irradiated using a particle beam. The movement device may be designed as a mechanically driven and/or electrically driven device. For example, the movement device is designed as a receptacle, in particular a threaded receptacle, for arranging a manipulator rod. Using the manipulator rod, it is then possible to remove the receiving element from the carrier element, subsequently connect it to the carrier element again, and bring the receiving element into a position in which a specimen may be irradiated using a particle beam.

The movement device may also be designed as automatically controllable. At least one control unit and at least one electrical drive are provided for this embodiment.

In a further embodiment, the movement device is designed as a manipulator rod and in some cases as a wobble rod.

All of the above-mentioned embodiments of the particle beam device according to the system described herein may have at least one detector for detecting particles which are emitted, transmitted, and/or scattered by one specimen or multiple specimens. For example, a detector situated in an objective lens of the particle beam column is provided as the detector. Alternatively or additionally thereto, a detector is provided, using which particles transmitted by the specimen or one of the specimens or scattered particles exiting in the propagation direction of a particle beam from the specimen or one of the specimens are detected. A detector system suitable for this purpose is known, for example, from WO 2005/006384, which is incorporated herein in its entirety.

Another embodiment of the above-mentioned particle beam devices has at least one beam generator for generating a particle beam and at least one beam guiding system for guiding a particle beam in the particle beam device. The above-mentioned detector may be situated behind the carrier element viewed from the beam generator in the direction of the carrier element (i.e., the detector known from WO 2005/006384). Furthermore, the particle beam device may have at least one objective lens for focusing a particle beam on a specimen.

In a further exemplary embodiment, the particle beam device is provided with at least one vacuum chamber, on which the particle beam column is situated and in which the carrier element is situated.

In another embodiment, particle beam device according to the system described herein may have multiple particle beam columns. It is thus provided that the above-mentioned particle beam column is designed as a first particle beam column having a first optical axis. Furthermore, a further particle beam column in the form of a second particle beam column is provided, which has a second optical axis. The first optical axis and the second optical axis may enclose an angle. This angle may be in a range of 20° to 90°. The first particle beam column may have the above-mentioned beam generator in the form of a first beam generator for generating a first particle beam and the above-mentioned beam guiding system in the form of a first beam guiding system for guiding a first particle beam. The second particle beam column, in contrast, has at least one second beam generator for generating a second particle beam and at least one second beam guiding system for guiding a second particle beam in the second particle beam column. For example, a first particle beam of the first particle beam column is used for observing and studying a specimen, while a second particle beam of the second particle beam column is used for preparing the specimen.

It may additionally be provided that the above-mentioned objective lens of the first particle beam column is designed as a first objective lens for focusing a first particle beam on a specimen and the second particle beam column has a second objective lens for focusing a second particle beam on a specimen.

In another embodiment of the system described herein, the first particle beam column is designed as an electron column and the second particle beam column is designed as an ion column. In particular, studying a specimen using an electron beam and preparing the specimen using an ion beam is provided.

Furthermore, it may be provided in an embodiment of the system described herein that the carrier element is designed to be rotatable around the first axis up to at most 360°, specifically up to at most 300°, and more specifically up to at most 240°. A further embodiment provides that the carrier element is designed to be rotatable around the first axis up to at most 180°.

In another embodiment of the system described herein, the carrier element is designed to be rotatable around the second axis up to at most 90°, specifically up to at most 60°, and more specifically up to at most 45°. In a further embodiment, the carrier element is designed to be rotatable up to at most 30° around the second axis.

Because of the particular design of the carrier element and the receiving element(s), the system described herein ensures sufficient free moving space in spite of possible restriction of the movement freedom of the carrier element (for example, a specimen table).

The system described herein also relates to an electron microscope, in particular a scanning electron microscope or a transmission electron microscope, which is designed as a particle beam device, which has one of the above-mentioned features or a combination of above-mentioned features.

The system described herein also relates to a system for receiving one or more specimens which has at least one carrier element and receiving elements. The carrier element is designed movably in three spatial directions situated perpendicular to one another and as rotatable around a first axis and around a second axis; which is situated perpendicular to the first axis. Furthermore, at least one first receiving element having a first receptacle axis for receiving a first specimen and at least one second receiving element having a second receptacle axis for receiving a second specimen are provided, the first receptacle axis and the second receptacle axis being situated offset to one another by an angle in the range of 10° to 90°. A range of 20° to 90° is preferred. In one exemplary embodiment, the first receiving element has a first receiving surface, whose surface normal corresponds to the first receptacle axis. This is correspondingly true for the second receiving element. This has a second receiving surface whose surface normal corresponds to the second receptacle axis. However, the system described herein is not restricted to this definition. For example, the first receiving element may also have a first receiving surface which is situated in a first plane in which the first receptacle axis lies, while the second receiving element has a second receiving surface which is situated in a second plane in which the second receptacle axis lies. The first plane and the second plane are then situated offset to one another by an angle of 10° to 90°. Other definitions are also conceivable, however. For example, a longitudinal axis of the second receiving element and a surface normal of the first receiving element may also enclose the above-mentioned angle.

The system described herein also relates to a system having at least one carrier element and at least one receiving element for receiving a specimen, the receiving element being removably connected to the carrier element and having a receptacle axis. The receptacle axis may be a surface normal of a receiving surface of the receiving element. The receiving element may be taken out of at least one first position by removal from the carrier element and brought into at least one second position by subsequent connection to the carrier element, the receptacle axis in the first position and the receptacle axis in the second position being situated at an angle in the range of 20° to 160° to one another. In another embodiment, it is provided that the carrier element is designed movably in three spatial directions situated perpendicular to one another, and is rotatable around a first axis and around a second axis which is situated perpendicular to the first axis.

The above-mentioned embodiments of the system described herein are particularly provided for use in the particle beam device which was already described above with its individual features and feature combinations and are intended for this particle beam device. The systems have the same advantages which were already cited above or are cited below. In particular, because of the design of the carrier element and the receiving element(s), sufficient free moving space is ensured in spite of possible restriction of the movement freedom of the carrier element (e.g., a specimen table).

The above-mentioned systems may have an angle between the axes in the range of 30° to 90°, e.g., 54° or 90°.

In another embodiment of the system described herein, the carrier element is designed to be rotatable around the first axis up to at most 360°, specifically up to at most 300°, and more specifically up to at most 240°. In a further embodiment, the carrier element is designed to be rotatable around the first axis up to at most 180°.

In a further embodiment of the system described herein, the carrier element is designed to be rotatable around the second axis up to at most 90°, specifically up to at most 60°, and more specifically up to at most 45°. In a further embodiment, the carrier element is designed to be rotatable around the second axis up to at most 30°.

The system described herein also relates to a method for studying or preparing a specimen, which is provided in particular for use in an above-mentioned particle beam device, in particular in an electron microscope. In the method according to the system described herein, it is first provided that a first specimen is situated on a first receiving element of the carrier element in a vacuum chamber. The carrier element is situated in such a way that it is movable in three spatial directions situated perpendicular to one another. Furthermore, it is situated in such a way that it is rotatable around a first axis, which is situated parallel to the optical axis or corresponds to the optical axis, and around a second axis, which is situated perpendicular to the optical axis. The first specimen, which is situated in the first receiving element, may be implemented as quite large. The carrier element is moved into at least a first position, a second specimen being extracted from the first specimen in the first position. Subsequently, the second specimen is fastened to a second receiving element of the carrier element and the carrier element is moved into at least one second position in which the second specimen is irradiated. Both the first receiving element and also the second receiving element are always moved in the same spatial direction and/or around the same axis by the movement of the carrier element.

In an embodiment, it may be provided that the first specimen is studied (for example, observed) using a first particle beam and the second specimen is extracted using a second particle beam. Furthermore, it is provided that the second specimen is irradiated (for example, observed) using the first particle beam in the second position. In a further embodiment, it is provided that the second specimen is situated on a manipulation device and subsequently arranged on the second receiving element using the manipulation device. Furthermore, it is may be provided that the second specimen is prepared (for example, polished) using the second particle beam and subsequently studied in the second position using the first particle beam.

In a further method according to the system described herein for studying or preparing a specimen, in particular for use in a particle beam device, a specimen is situated on a receiving element of a carrier element in a vacuum chamber, the receiving element being removably connected to the carrier element. By removing the receiving element from the carrier element and subsequently connecting it to the carrier element, the receiving element is brought into at least one position, and may be at least two positions, in such a way that the specimen is irradiated using a particle beam. The receiving element may be brought into the at least one position using a movement device.

In a further method according to the system described herein, it may be provided that a first specimen is situated on one of two receiving elements of a carrier element in a vacuum chamber, the carrier element being movable in three spatial directions situated perpendicular to one another and the carrier element being rotatable around a first axis which is situated parallel to the optical axis of a particle beam device or corresponds to the optical axis, and around a second axis, which is situated perpendicular to the optical axis. Furthermore, the carrier element is moved into at least one first position, the first specimen being prepared in the first position. Subsequently, the carrier element is moved into at least one second position, in which the first specimen is studied. The first receiving element and the second receiving element are always moved in the same spatial direction and/or around the same axis by the movement of the carrier element. For example, it is possible using the method described here that the carrier element is moved between a position in which a specimen is polished and a position in which the specimen is studied using a transmission measurement method, for example.

BRIEF DESCRIPTION OF THE DRAWINGS

Embodiments of the system described herein are explained in greater detail hereafter using figures that are briefly described as follows.

DETAILED DESCRIPTION OF VARIOUS EMBODIMENTS

Figure 1:
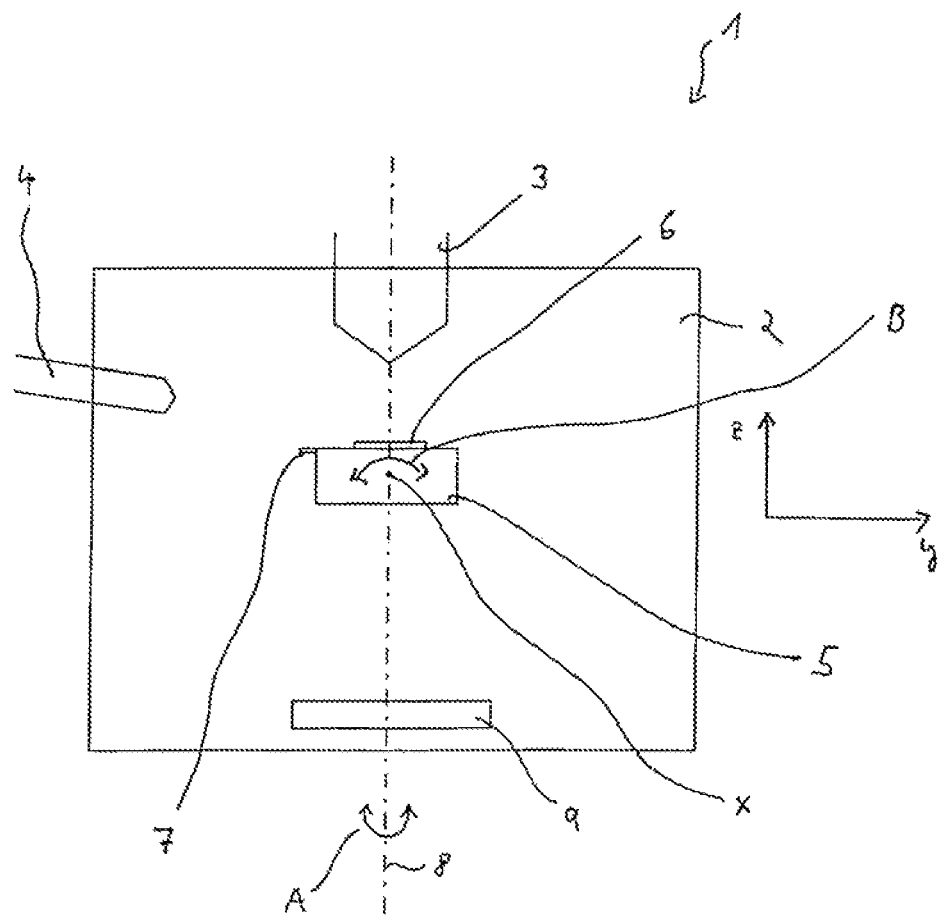
FIG. 1 shows a schematic illustration of a particle beam device having a vacuum chamber according to an embodiment of the system described herein.

FIG. 1 shows a schematic illustration of a particle beam device 1 in the form of a scanning electron microscope, which is designed having an ion beam unit according to an embodiment of the system described herein. Therefore, both a first particle beam column 3 in the form of an electron column and also a second particle beam column 4 in the form of an ion column are situated on a vacuum chamber 2. The construction of individual particle beam columns 3 and 4 will be described in greater detail below.

Figure 3:
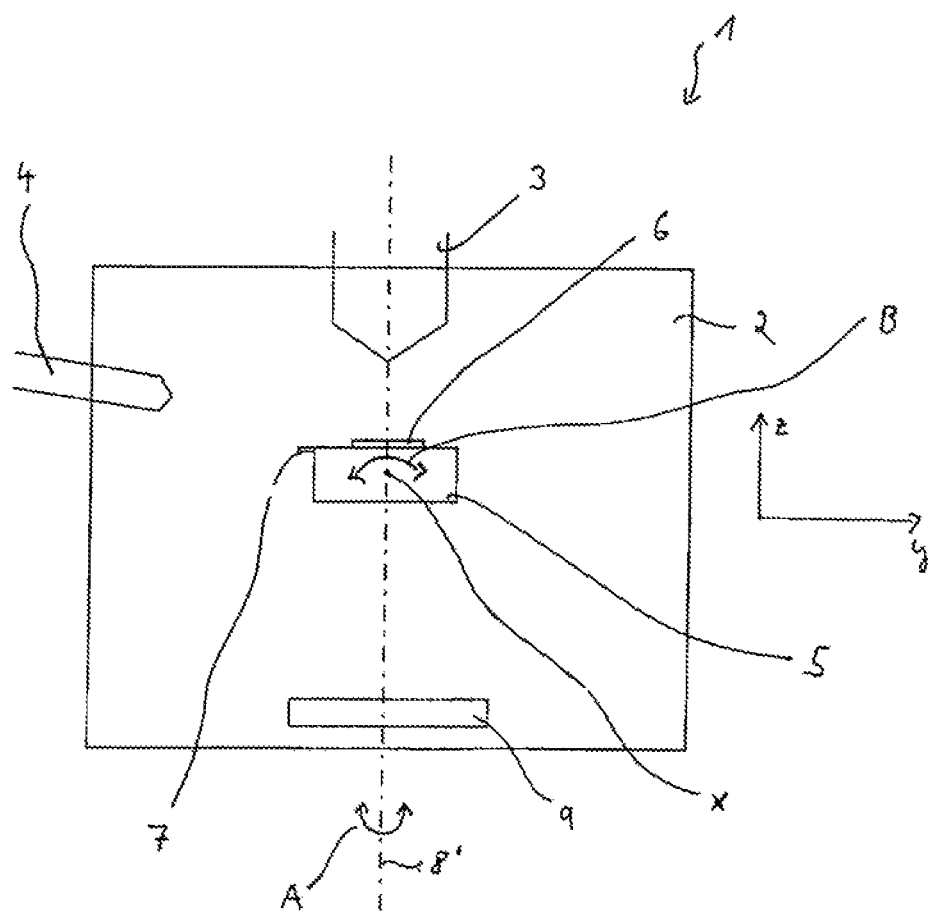
FIG. 3 shows a schematic illustration of a further particle beam device having a vacuum chamber according to an embodiment of the system described herein.

Furthermore, a carrier element 5 in the form of a specimen table is situated in vacuum chamber 2. Carrier element 5 is designed movably in three spatial directions x, y, and z situated perpendicular to one another. Spatial directions z and y are shown laterally from vacuum chamber 2. Spatial direction x is perpendicular to the image plane. In addition, carrier element 5 is arranged in such a way that it is rotatable around an axis 8, which is indicated by arrow A. Axis 8 is situated parallel to the first optical axis of first particle beam column 3. In a further exemplary embodiment, which corresponds in its entire construction and function to the exemplary embodiment shown in FIG. 1 and is shown in FIG. 3, axis 8 corresponds to first optical axis 8'. Carrier element 5 may be rotatable by at most 180°, alternatively up to at most 240° or 300°, and/or alternatively up to at most 360° around axis 8.

Furthermore, carrier element 5 is also pivotable around spatial direction axis x, which is perpendicular to axis 8 and thus also perpendicular to the first optical axis. The ability to pivot is indicated by an arrow B. The pivoting occurs on both sides of arrow B in a range of at most approximately 90°, specifically in a range up to at most 60° or 45°, and more specifically in a range up to at most 30°. In an embodiment, the pivoting may be performed by at most 15° in one direction and by at most 60° in the other direction.

Carrier element 5 is provided with a first receiving element 6, on which a first specimen is situated. In addition, carrier element 5 is provided with a second receiving element 7, on which a second specimen is situated. This is described in greater detail below.

In vacuum chamber 2, a detector 9 is situated further from first particle beam column 3 in the direction of axis 8, which is capable of detecting scattered or transmitted electrons exiting from a specimen. For example, a detector according to WO 2005/006384 A2 is provided.

Second particle beam column 4 has a second optical axis 10. First particle beam column 3 and second particle beam column 4 are situated in relation to one another in such a way that the first optical axis and second optical axis 10 are situated tilted to one another at an angle α (cf. FIG. 2). Angle α is in a range of 20° to 90°. In some cases, it may be approximately 54°.

Particle beam device 1 and the method according to the system described herein applicable thereto will be explained hereafter on the basis of the further figures.

Figure 4:
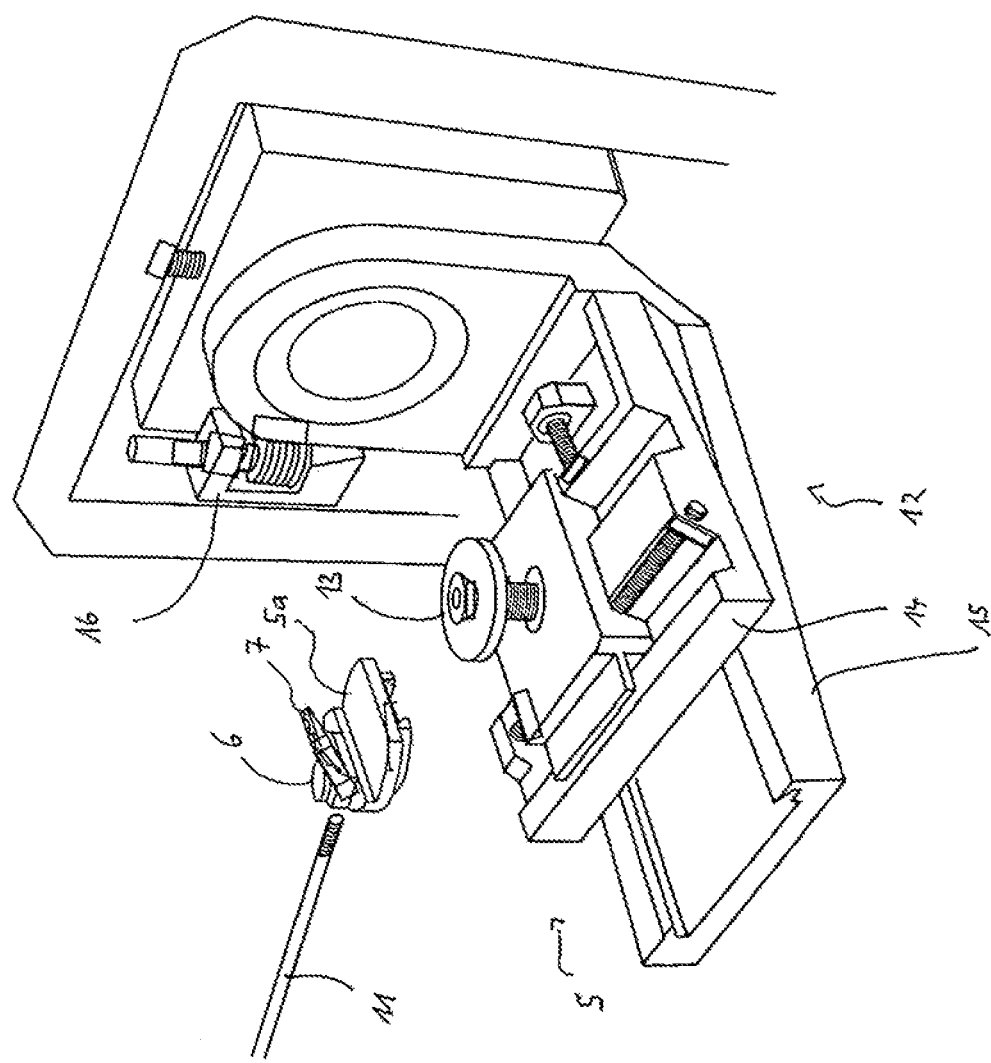
FIG. 4 shows a schematic illustration of a carrier element according to an embodiment of the system described herein.

FIG. 4 shows the insertion of a holder 5a of carrier element 5, on which both first receiving element 6 and also second receiving element 7 are situated. First receiving element 6 and second receiving element 7 have receiving surfaces whose surface normals enclose an angle β to one another. In this exemplary embodiment, the surface normal of second receiving element 7 is situated parallel to a longitudinal axis of receiving element 7 which has the shape of an arm (cf. FIG. 6). Angle β may be in a range of 20° to 90° and in some cases approximately 54°. The latter ensures, if particle beam columns 3 and 4 are situated at 54° to one another, that the carrier element having a specimen situated on receiving element 7 does not have to be tilted upon irradiation using ions.

Figure 2:
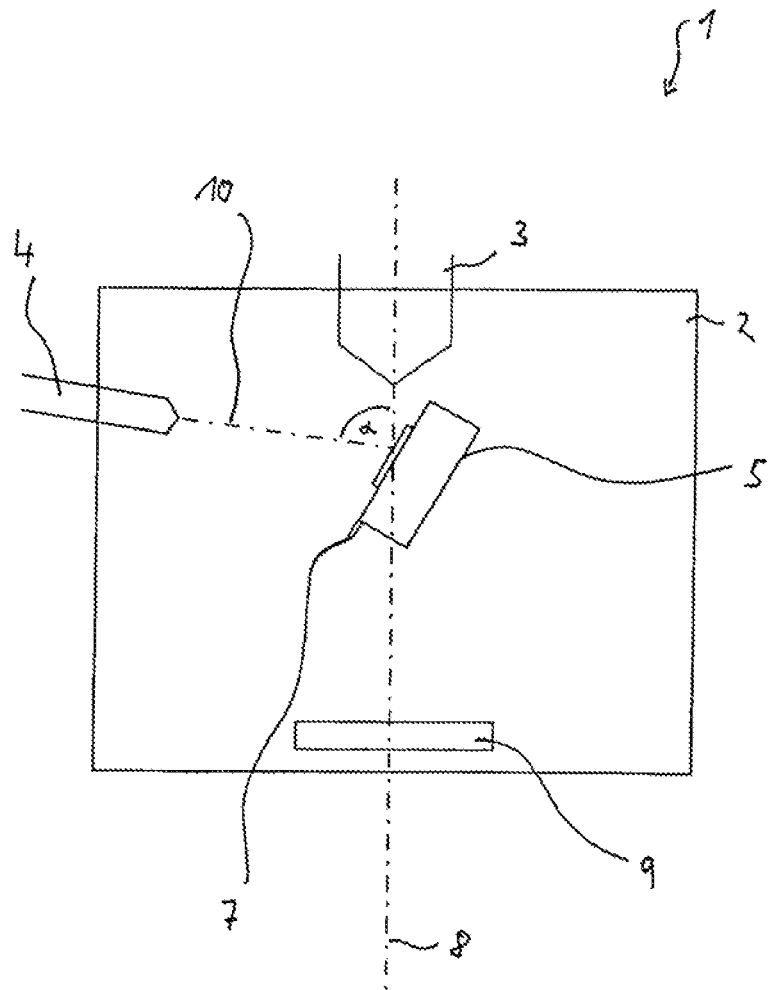
FIG. 2 shows a further schematic illustration of the particle beam device from FIG. 1.

In contrast to the exemplary embodiment from FIG. 4, receiving elements 6 and 7 from FIGS. 1 through 3 may be situated offset by an angle β of approximately 90°.

Figure 5:
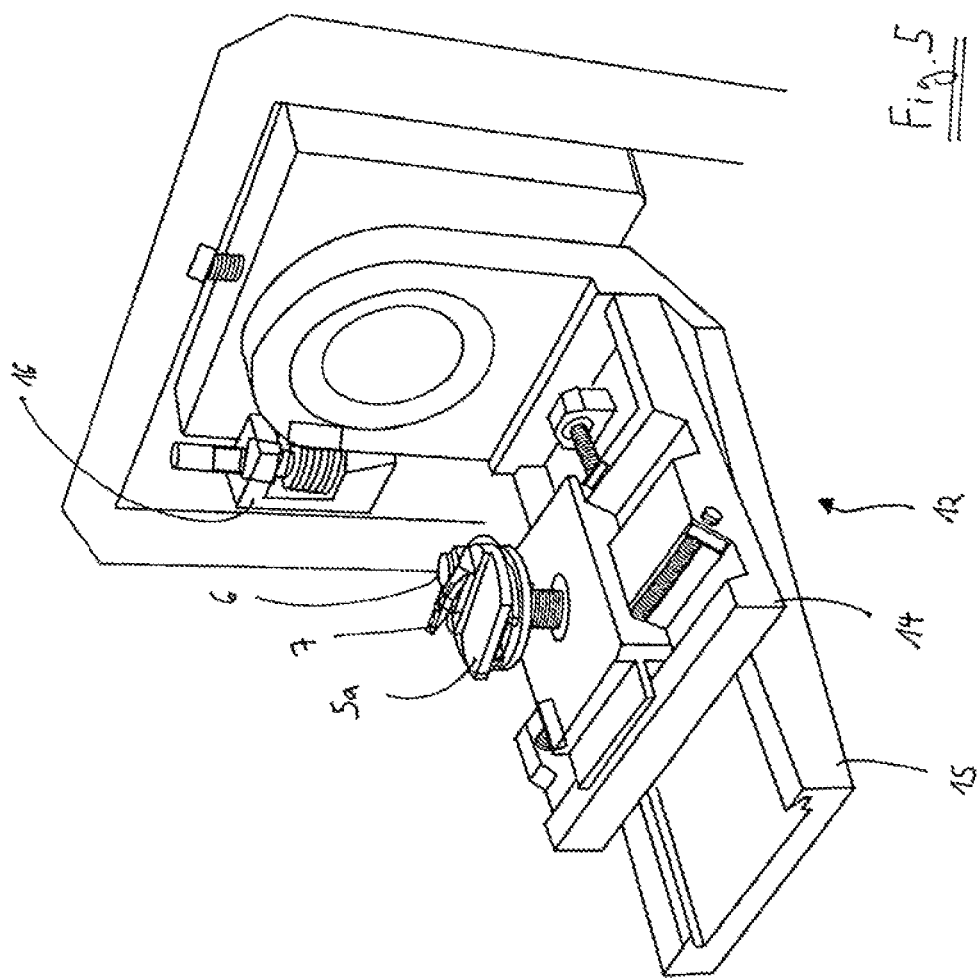
FIG. 5 shows a further schematic illustration of the carrier element from FIG. 4.

As is apparent from FIG. 4, holder 5a is situated on a further holder 13 of carrier element 5 using a manipulator 11. Carrier element 5 is provided with a positioning device 12 which has a slide mechanism 14 for adjustment in the y direction and a slide mechanism 15 for adjustment in the x direction. Furthermore, a displacement device 16 is also provided for adjustment in the z direction. The mechanisms for the rotation described above are not shown in FIG. 4. FIG. 5 shows the exemplary embodiment from FIG. 4 after completed insertion.

Figure 6:
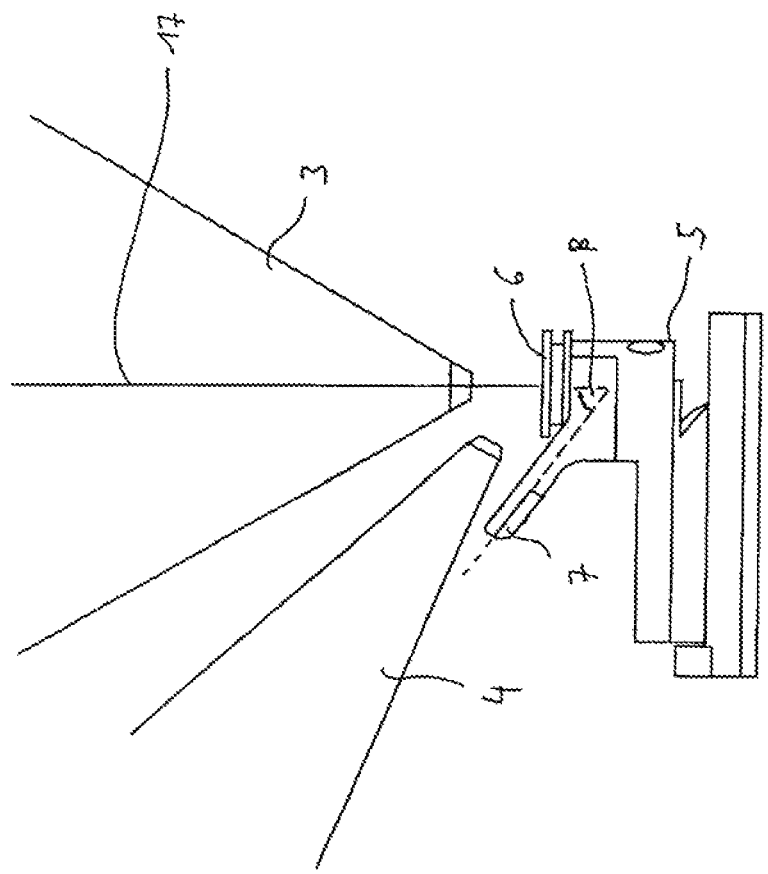
FIG. 6 shows a further schematic illustration of the particle beam device from FIG. 1, a specimen fastened to a receiving element being studied.
Figure 7:
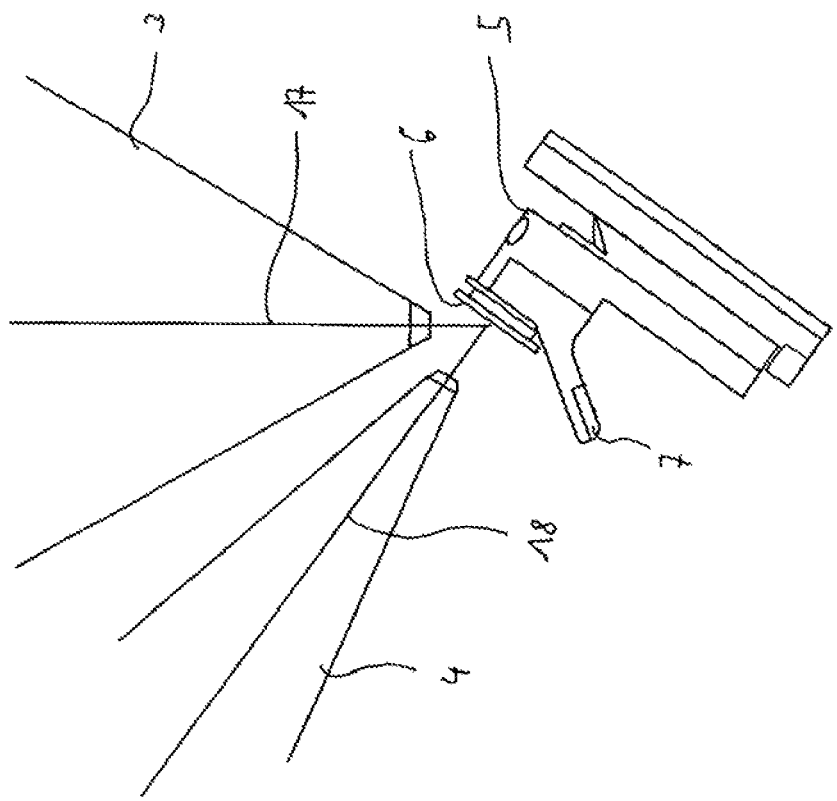
FIG. 7 shows a further schematic illustration of the particle beam device from FIG. 1, a specimen fastened to a receiving element being processed.

FIG. 6 schematically shows a further method step. Using an electron beam 17, which is directed essentially perpendicularly onto the first specimen situated on first receiving element 6, an image of the specimen surface (scanning image) is generated and an area of interest for further study is ascertained. Subsequently, carrier element 5 is tilted in such a way that this area of interest of the first specimen situated on first receiving element 6 is situated essentially perpendicular to an ion beam 18 incident on the first specimen (cf. FIG. 7). In this position, a second specimen which is part of the first specimen is prepared using ion beam 18. In addition thereto, the second specimen may now already be cut out of the first specimen using ion beam 18. Both the cutting out and also the preparation are observable using electron beam 17 by scan imaging.

Figure 8:
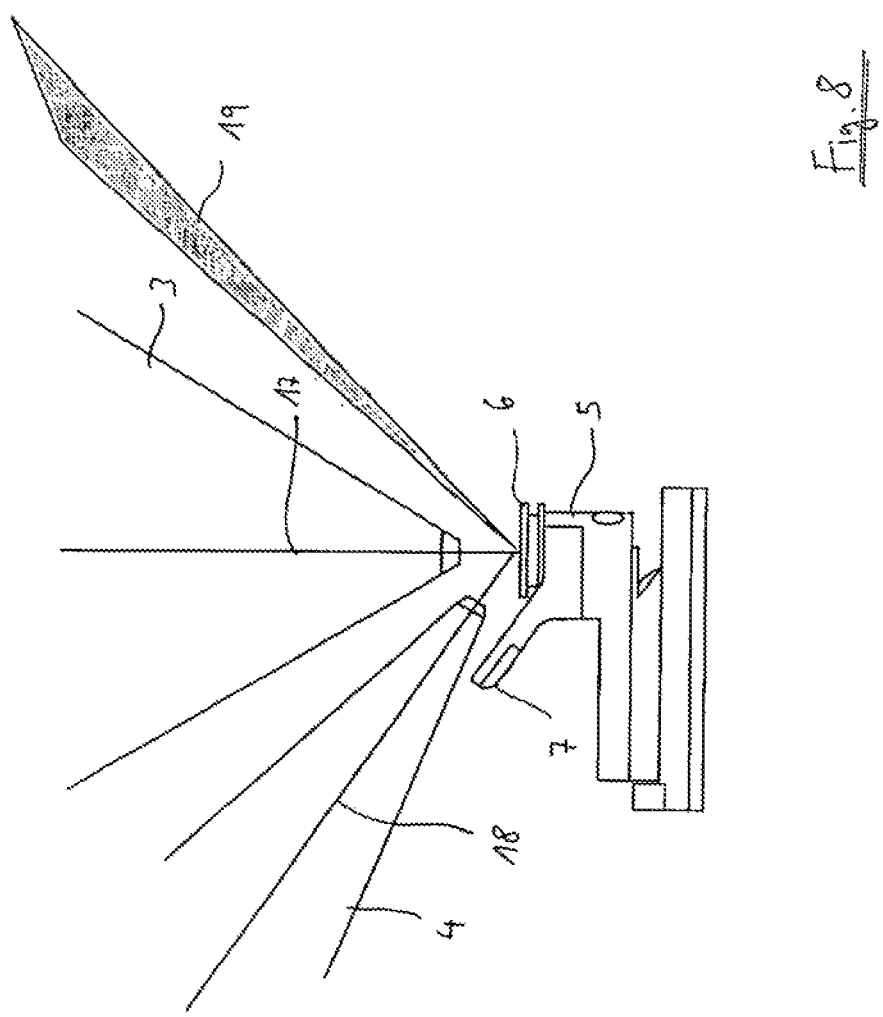
FIG. 8 shows a further schematic illustration of the particle beam device from FIG. 1 having a micromanipulator.
Figure 9:
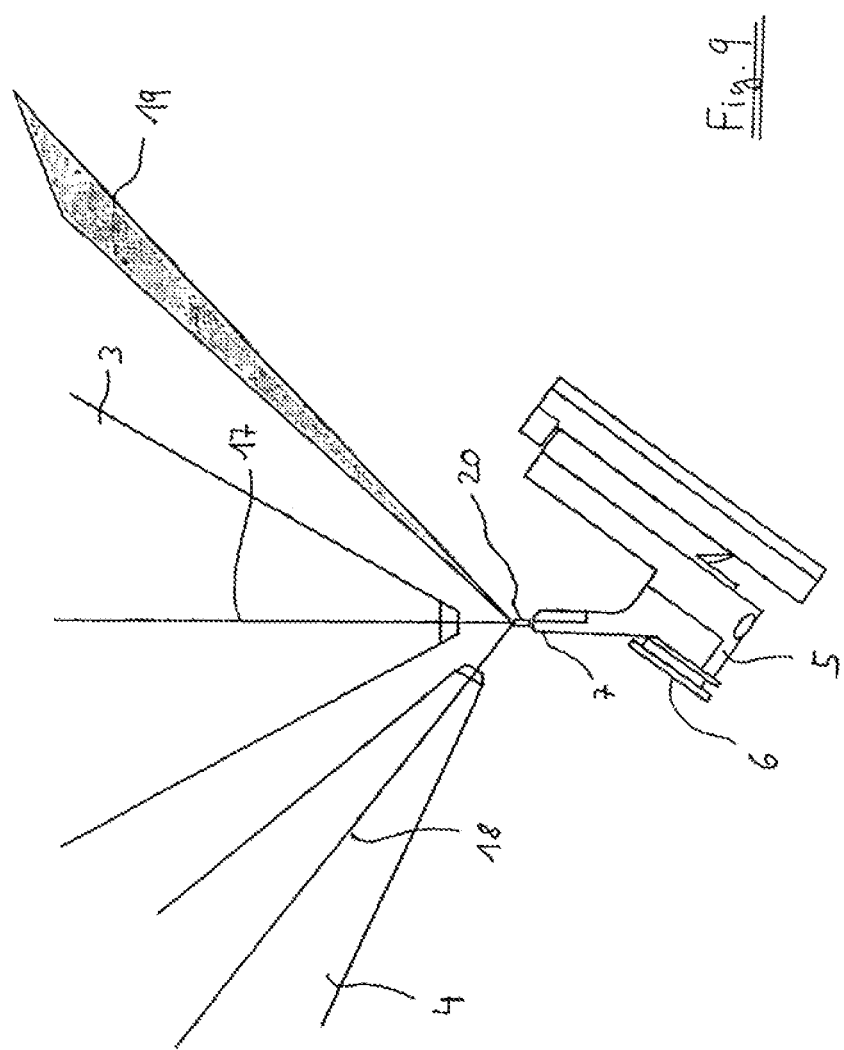
FIG. 9 shows a further schematic illustration of the particle beam device from FIG. 1 having the micromanipulator.

In the exemplary embodiment shown in the figures, two possible types of treatment of the second specimen are further provided. The first type is shown in FIGS. 8 and 9. In this type, the surface (receiving surface) of first receiving element 6 is oriented perpendicular to the optical axis of first particle beam column 3. The second specimen is cut out of the first specimen using ion beam 18. For example, this is performed using a method which is known from U.S. Pat. No. 6,963,068 B2, which is incorporated herein by reference in its entirety. The cutting out is observed using electron beam 17 by scan imaging. Using a micromanipulator 19 designed as movable, the second specimen is subsequently lifted out of the first specimen (lift out). For this purpose, the second specimen is previously fixed on micromanipulator 19. For this purpose, micromanipulator 19 is brought into proximity to the first specimen in such a way that the second specimen may be fastened to micromanipulator 19. The system described herein is not restricted to a specific type of fastening. Rather, any type of fastening is usable which is capable of fastening the second specimen to micromanipulator 19. For example, the second specimen may be fastened to micromanipulator 19 using a clamping device. Alternatively, or additionally thereto, the second specimen is fastened to micromanipulator 19 using an ion-beam-induced deposition layer, which is generated by focused ion beams in a gas atmosphere. A fastening method of this type is known, for example, from DE 42 26 694 C2, which is incorporated herein by reference in its entirety.

After the second specimen is fastened to micromanipulator 19, the second specimen is extracted from the first specimen and fastened to second receiving element 7 in a further method step. This is shown in greater detail in FIG. 9. For this purpose, in the exemplary embodiment shown, carrier element 5 is moved in such a way that the surface normal of the receiving surface of second receiving element 7 is oriented essentially parallel to the optical axis of first particle beam column 3 (electron column). Using the scan imaging by electron beam 17 it is then observable how second specimen 20 is removed from micromanipulator 19 using ion beam 18 and fastened to second receiving element 7. Again, any type of fastening which is capable of fastening the second specimen to second receiving element 7 may be selected, for example, the above-mentioned types of fastening.

Figure 10:
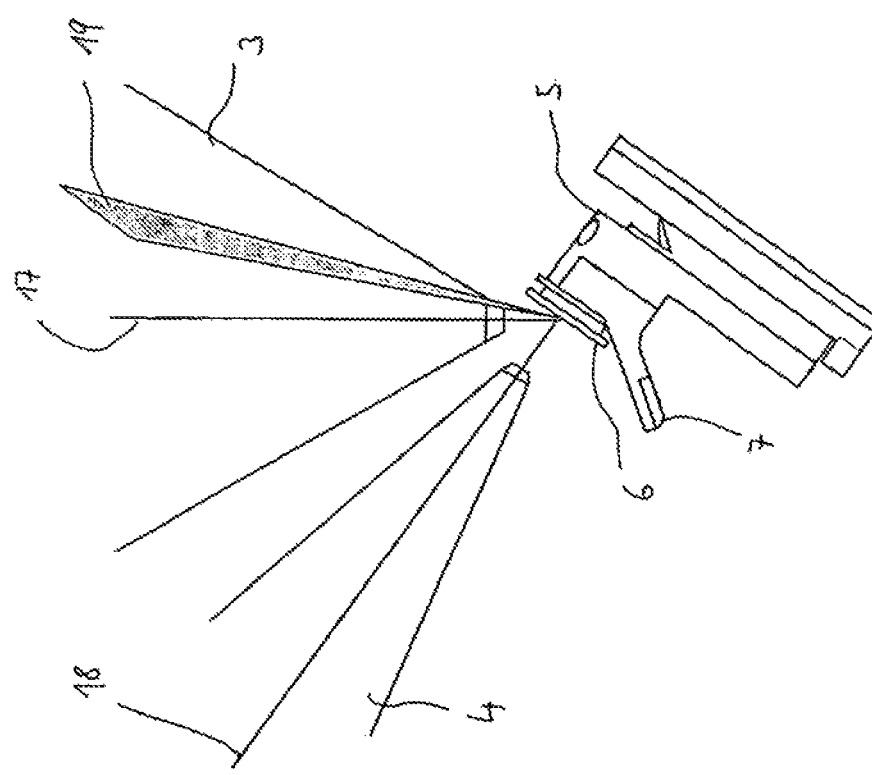
FIG. 10 shows a further schematic illustration of the particle beam device from FIG. 1 having the micromanipulator.
Figure 11:
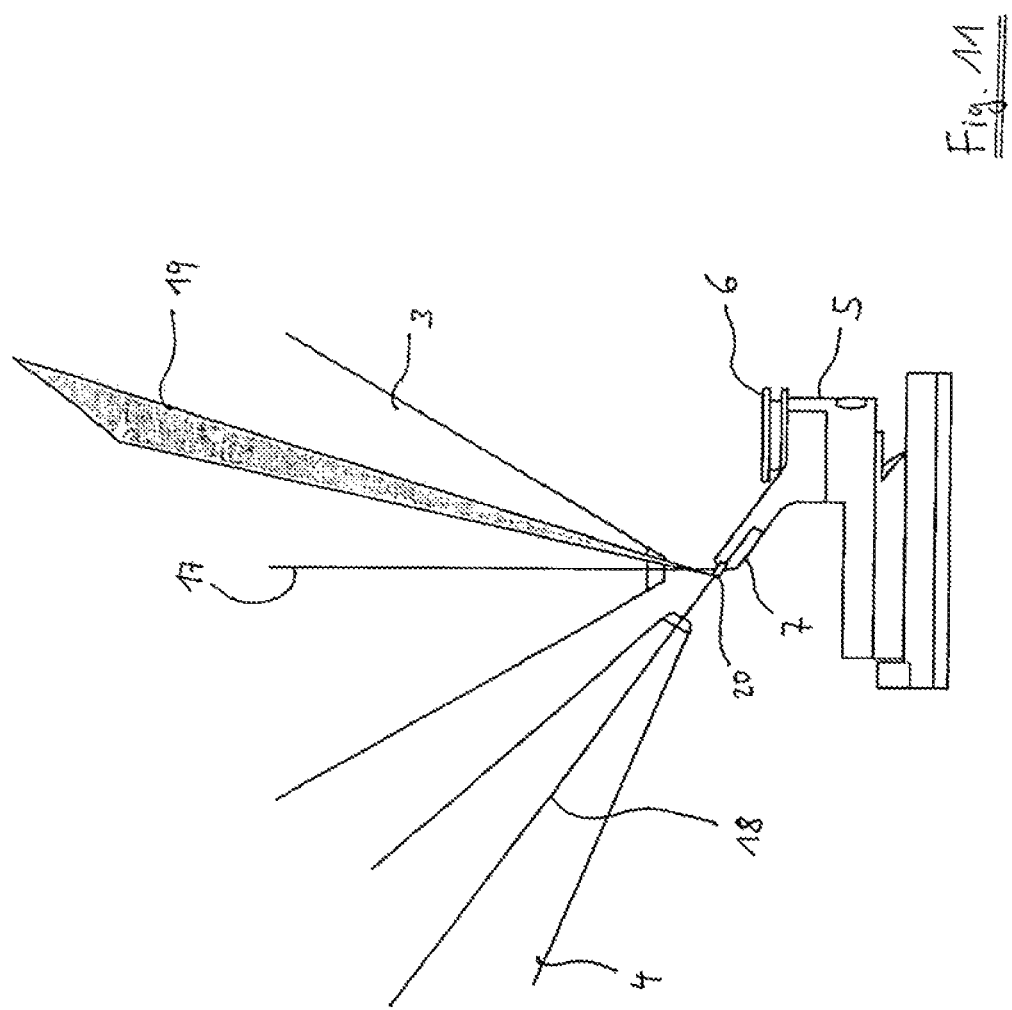
FIG. 11 shows a further schematic illustration of the particle beam device from FIG. 1 having the micromanipulator.

The second type of further treatment is shown in FIGS. 10 and 11. However, the second type only differs from the first type in that the cutting out and lifting out occurs in a position in which carrier element 5 is tilted and the receiving surface of the first receiving element is situated perpendicular to the optical axis of second particle beam column 4. All steps explained in reference to FIGS. 8 and 9 are therefore also applicable to the exemplary embodiment shown in FIGS. 10 and 11, the fixing of second specimen 20 on second receiving element 7 being performed when the receiving surface of first receiving element 6 is oriented perpendicular to the optical axis of first particle beam column 3.

Figure 12:
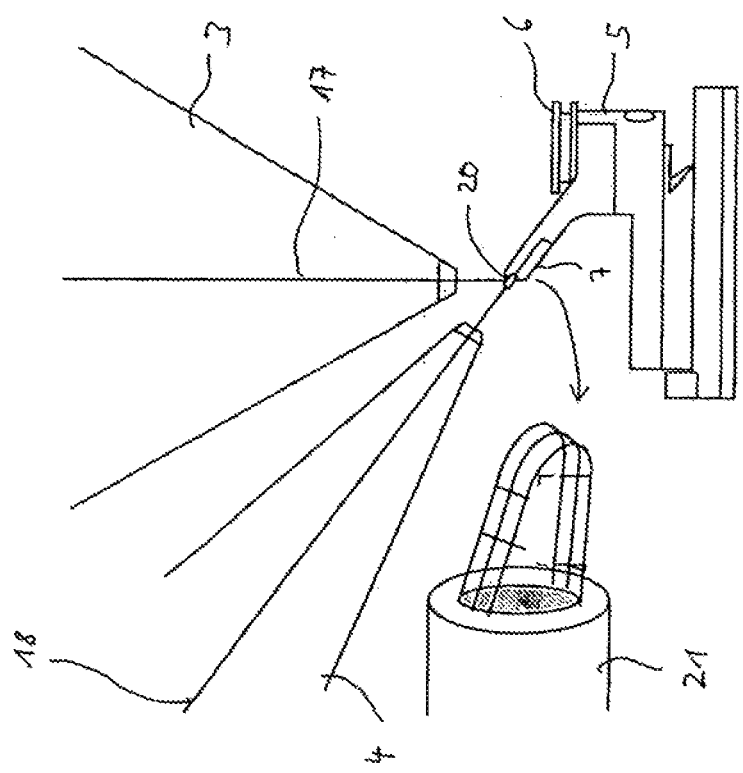
FIG. 12 shows a schematic illustration of a specimen preparation in the particle beam device from FIG. 1.

Second specimen 20 is prepared further in a further method step. In the exemplary embodiment from FIG. 12, second specimen 20 is oriented in relation to ion beam 18 by movement of carrier element 5 in such a way that second specimen 20 is polished. This procedure is observable using electron beam 17 by scan imaging. The polishing is performed until an electron transparency occurs on specimen areas denoted by small Z. The electrons passing through second specimen 20 because of the electron transparency are detected using a detector 21.

Carrier element 5 is subsequently moved and/or pivoted again in such a way that second specimen 20 may be impinged essentially perpendicularly by electron beam 17. Electrons are guided to second specimen 20 situated on second receiving element 7 using electron beam 17. Detector 9 having a detector surface 22 is situated below second specimen 20. It is thus possible to detect the electrons scattered by second specimen 20 or the electrons transmitted through second specimen 20 using detector 9 and use them for imaging (cf. FIG. 13). Conclusions about second specimen 20 are thus possible. In particular, it may be established whether the preparation of second specimen 20 was sufficient or must be repeated once again.

The system described herein also has the advantage that receiving elements 6 and 7 do not have any movement mechanisms, because all required movements may be implemented via the degrees of freedom of carrier element 5. In particular, it is advantageous if angle α between the optical axes of particle beam columns 3 and 4 corresponds to angle β of receiving elements 6 and 7. In this case, it is often not necessary to move carrier element 5 when the optical axis of first particle beam column 3 is perpendicular to the surface of receiving element 6 and the specimen situated on receiving element 7 is to be impinged using an ion beam, because the specimen is already in a good position for irradiation.

Figure 13:
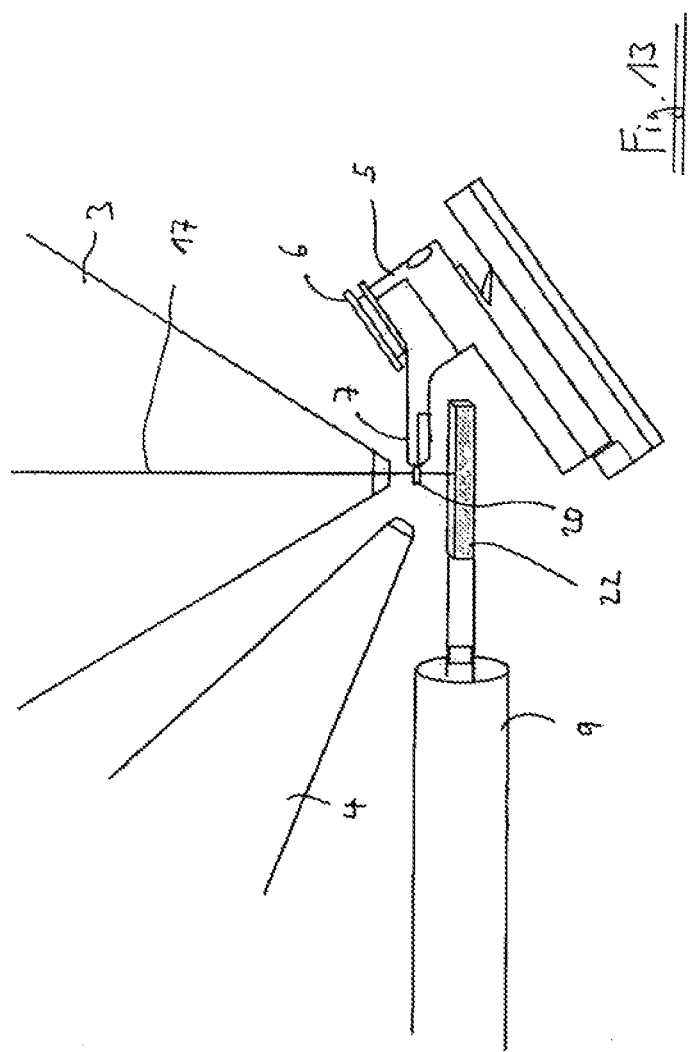
FIG. 13 shows a schematic illustration of a specimen study in the particle beam device from FIG. 1.
Figure 14:
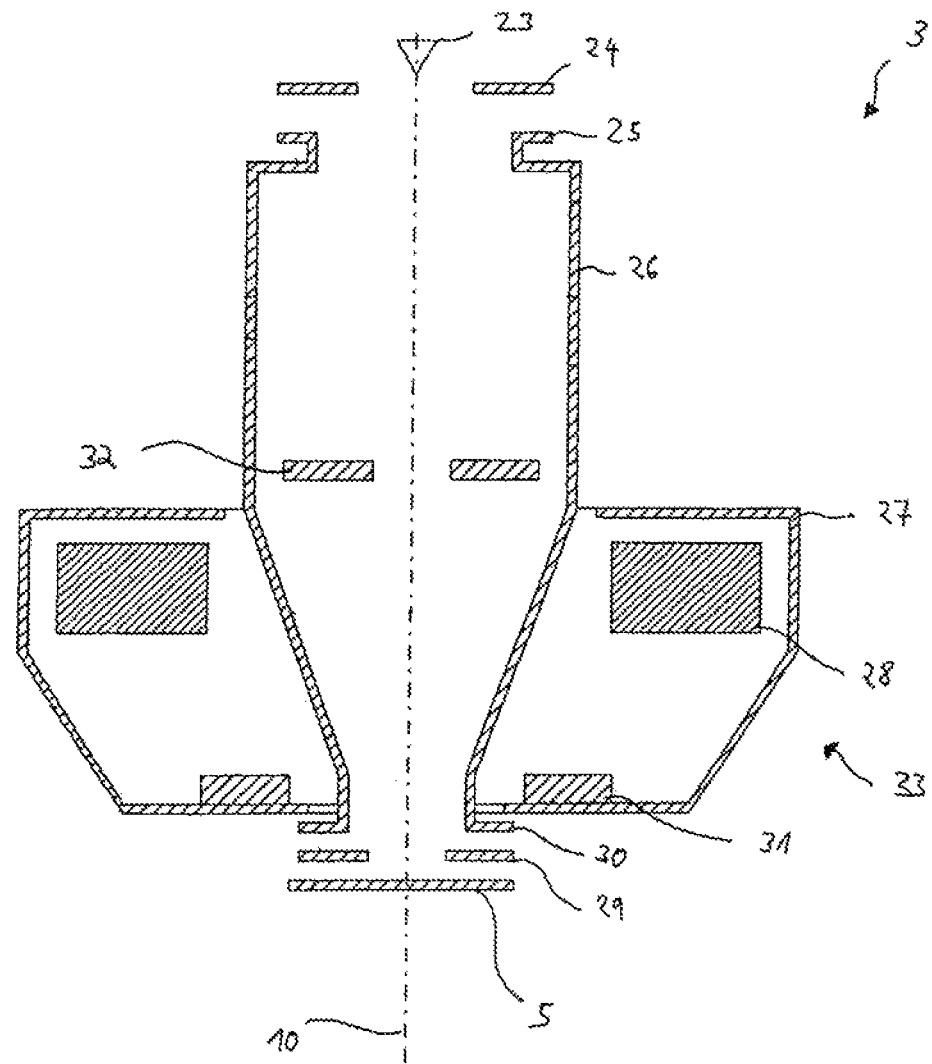
FIG. 14 shows a schematic illustration of a first particle beam column in the form of an electron column according to an embodiment of the system described herein.

FIG. 14 shows a schematic illustration of first particle beam column 3, which is designed as an electron column and essentially corresponds to an electron column of a scanning electron microscope. First particle beam column 3 has a beam generator in the form of an electron source 23 (cathode), an extraction electrode 24, and an anode 25, which simultaneously forms one end of a beam guiding tube 26. The electron source 23 may be a thermal field emitter. Electrons which exit from electron source 23 are accelerated to anode potential because of a potential difference between electron source 23 and anode 25. Furthermore, an objective lens 33 is provided which has a bore hole through which beam guiding tube 26 passes. Objective lens 33 also has pole shoes 27 in which coils 28 are situated, as have already been known for some time. An electrostatic deceleration unit is connected downstream from beam guiding tube 26. This includes an individual electrode 29 and a tube electrode 30, which is implemented on the end of beam guiding tube 26 opposite to carrier element 5. Carrier element 5 shown in FIG. 14 corresponds to carrier element 5 shown in FIGS. 1 through 13. It is to be noted that the distance of carrier element 5 from individual electrode 29 shown in FIG. 14 is to be understood as solely schematic and is sufficient so that an irradiation of a specimen situated on carrier element 5 by an ion beam which is generated using second particle beam column 4 is possible without further measures.

Tube electrode 30 is at anode potential together with beam guiding tube 26, while individual electrode 29 and a specimen situated on carrier element 5 are at a lower potential than the anode potential. In this way, the electrons of the electron beam may be decelerated to a desired low energy, which is required for the study of a specimen situated on carrier element 5. First particle beam column 3 also has scanning means 31, by which the electron beam may be deflected and scanned over a specimen situated on carrier element 5.

Secondary electrons and/or backscattered electrons, which arise because of the interaction of the electron beam with a specimen situated on carrier element 5, are employed for imaging using a detector 32 situated in beam guiding tube 26. The signals generated by detector 32 are transmitted to an electronic unit (not shown) for imaging.

Figure 15:
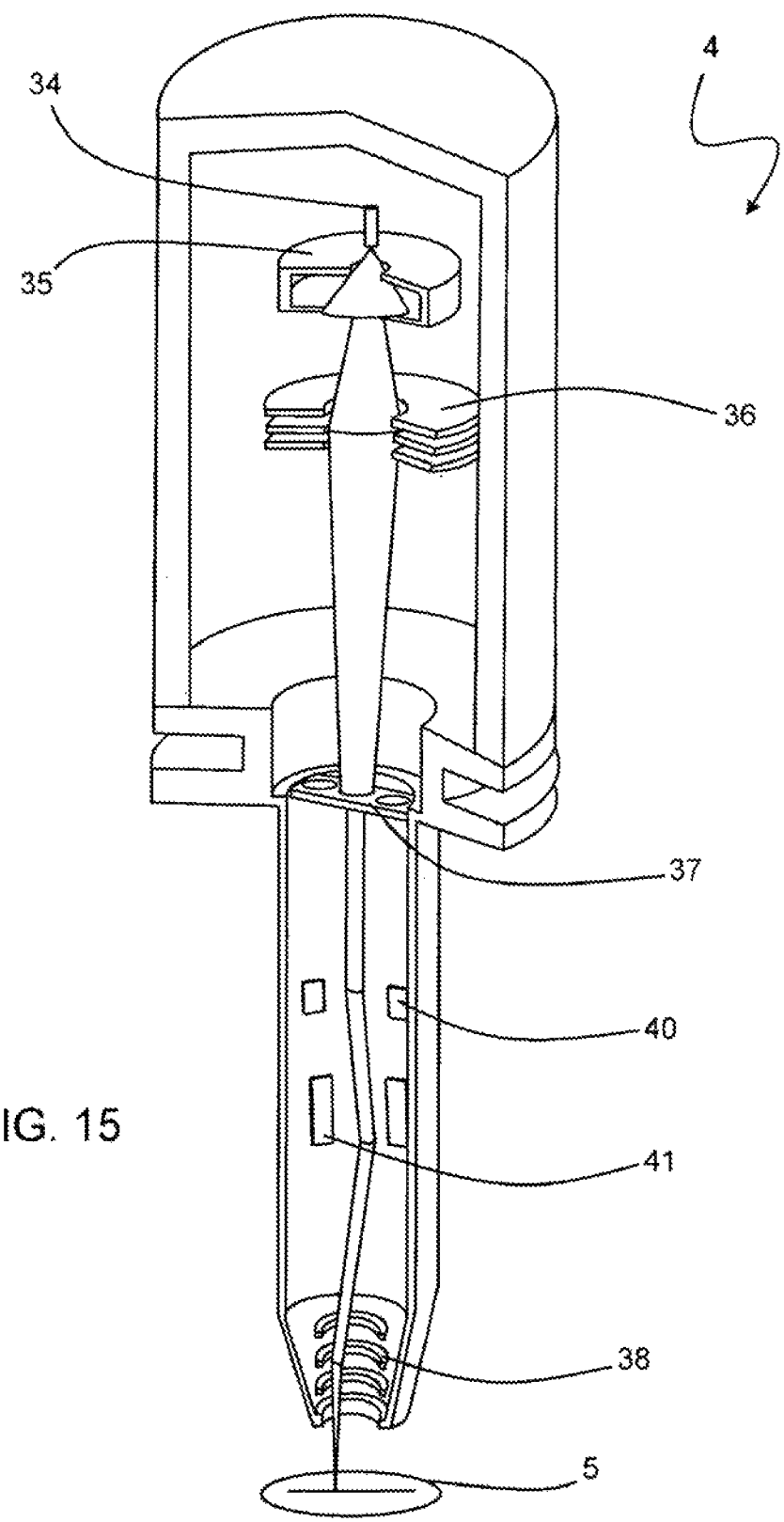
FIG. 15 shows a schematic illustration of a second particle beam column in the form of an ion column according to an embodiment of the system described herein.

FIG. 15 shows the construction of second particle beam column 4 in the form of the ion column. The construction of second particle beam column 4 essentially corresponds to the construction of first particle beam column 3. Using an ion beam generator 34, ions (ion beam) are generated and accelerated using an extraction electrode 35 to a certain potential. The ion beam then is guided through an ion optical system of second particle beam column 4, the ion optical system having a condenser lens 36 and a configuration of individual lenses 38. Lenses 38 (objective lens) finally generate an ion probe which is incident on a specimen situated on carrier element 5. An adjustable aperture 37 and two electrode configurations 40 and 41 are situated above lenses 38 (i.e., in the direction of ion beam generator 34), the electrode configurations being designed as scanning electrodes. The ion beam is scanned over a specimen situated on carrier element 5 using these scanning electrodes 40 and 41. Carrier element 5 also corresponds here to carrier element 5 from FIGS. 1 through 13. The distance of carrier element 5 from the end of second particle beam column 4 is only to be understood as schematic. Of course, carrier element 5 is situated in such a way that concurrent irradiation of a specimen situated on carrier element 5 by an electron beam which is generated using first particle beam column 3 is possible without further measures.

Through the configuration of first receiving element 6 and second receiving element 7 on carrier element 5, it is easily possible to extract a second specimen from a first specimen, and to prepare and study the second specimen, without the second specimen having to be discharged from vacuum chamber 2.

In some studies, it is sometimes not necessary to cut out a second specimen from a first specimen, prepare it, and study it. Rather, a pre-prepared specimen on carrier element 5 is inserted into vacuum chamber 2, the pre-prepared specimen being situated on second receiving element 7. In this method, one essentially moves back and forth between two positions of carrier element 5. In a first position, the pre-prepared specimen is polished. This essentially corresponds to FIG. 12. In a second position, the specimen is studied further by imaging, as shown in FIG. 13.

Figure 16:
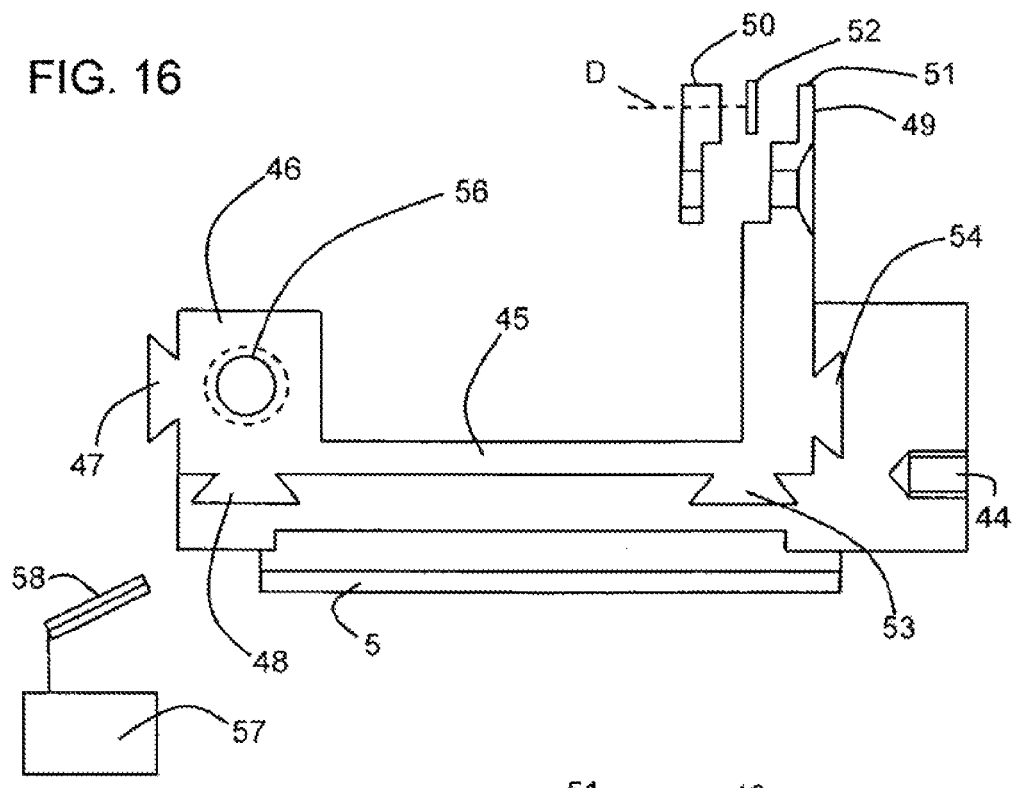
FIG. 16 shows a schematic illustration of a further carrier element in the first position according to an embodiment of the system described herein.
Figure 17:
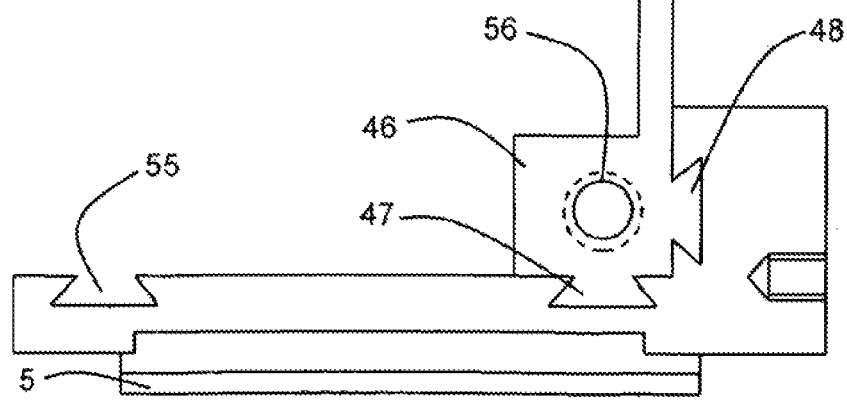
FIG. 17 shows a schematic illustration of the carrier element from FIG. 16 in a second position.

FIGS. 16 and 17 show a further exemplary embodiment of the system described herein which may be introduced into particle beam device 1 having two particle beam columns 3 and 4. The exemplary embodiment shown in FIGS. 16 and 17 has a carrier element 5 which may be movable similar to carrier element 5 already described above. It may be introduced into a vacuum chamber using a manipulator which may be situated on a thread 44 of carrier element 5.

A receiving element 45 is removably connected to carrier element 5. Receiving element 45 is connectable to carrier element 5 in such a way that receiving element 45 may assume at least two angular positions. The angular positions may be situated at an angle of 20° to 160° to one another. In the exemplary embodiment shown in FIGS. 16 and 17, two angular positions (position 1 in FIG. 16 and position 2 in FIG. 17) are provided, which are situated offset 90° to one another. To be able to assume these angular positions, guide elements are provided on receiving element 45 and carrier element 5 corresponding to the desired angular position, which establish the angular positions. In the exemplary embodiment shown in FIGS. 16 and 17, receiving element 45 has dovetail-shaped guide elements 47 and 48 on a first end 46. Furthermore, further guide elements 53 and 54 are provided, which are not shown in FIG. 17 for the sake of clarity. Guide elements 47, 48, 53, and 54 are situated in guide receptacles 55 implemented as complementary to guide elements 47, 48, 53, and 54 in such a way that receiving element 45 may be brought into the two positions situated at 90° to one another (angular positions) after removal from carrier element 5 and subsequent reconnection to carrier element 5. Receiving element 45 is moved by a schematically shown manipulator device 58 (i.e., removed from carrier element 5 in one position—for example the position in FIG. 16—and reconnected to carrier element 5 in another position—for example, the position in FIG. 17). As noted above, manipulator device 58 is only schematically shown in FIG. 16. It may be movable purely mechanically and/or may also be movable electrically and automatically using a schematically illustrated control unit 57 and an electric motor contained therein. To be able to move receiving element 45, manipulator device 58 engages in a threaded receptacle 56 of receiving element 45.

Clamping jaws 50 and 51 are situated on a second end 49 of receiving element 45, between which a specimen 52 (e.g., a lattice for a transmission electron microscope) is situated before inserting carrier element 5 and receiving element 45. Using manipulator device 58, receiving element 45 may be brought into the position shown in FIG. 16, in which it is irradiated using an ion beam from the ion beam column, for example. Subsequently, receiving element 45 may be brought into the position from FIG. 17, in which it is studied extensively using a scanning-transmission electron microscopy study. FIGS. 16 and 17 also show receptacle axis D in the area of clamping jaws 50, which is situated in the various positions in this exemplary embodiment at 90°.

It is to be expressly noted that the system described herein is not restricted to a combination of an electron column with an ion column. Rather, the particle beam device according to the system described herein may have columns which generate and guide any type of particle. The particle beam device according to the system described herein may also be designed having only a single column. Laser beams may also be used instead of particles.

Other embodiments of the invention will be apparent to those skilled in the art from a consideration of the specification or practice of the invention disclosed herein. It is intended that the specification and examples be considered as exemplary only, with the true scope and spirit of the invention being indicated by the following claims.

What is claimed is:

1. A method of operating a charged particle beam system, the charged particle beam system including a first charged particle beam column having a first optical axis and providing a first charged particle beam, a second charged particle column having a second optical axis and providing a second charged particle beam, the second optical axis being inclined relative to the first optical axis, and a carrier element which is rotatable around a first axis and a second axis, the first axis being perpendicular to the second axis, the method comprising:
providing a first receiving element and a second receiving element, wherein the first and the second receiving elements are situated on the carrier element in such a way that a movement of the carrier element always causes a movement of the first receiving element and the second receiving element around the same axis, wherein the first receiving element has a first receiving surface which lies in a first plane and the second receiving element has a second receiving surface which lies in a second plane, and wherein the first plane is inclined relative to the second plane by an angle in the range of 10° to 90°;
disposing a first specimen on the first receiving surface of the first receiving element;
recording an image of the first specimen using the first charged particle beam;
cutting a second specimen out of the first specimen using the second charged particle beam;
fastening the second specimen to the second receiving surface of the second receiving element; and
further processing the second specimen using the second charged particle beam.

2. The method of claim 1, further comprising:
rotating the carrier element around the second axis from a first rotational position, in which the first plane is oriented perpendicular to the first optical axis, into a second rotational position, in which the second plane is oriented perpendicular to the first optical axis.

3. The method of claim 1, further comprising:
rotating the receiving element after fastening the second specimen to the second receiving surface in a manner that the second receiving surface is oriented perpendicular to the second optical axis during the further processing of the second specimen.

4. The method of claim 3, wherein the first charged particle beam is an electron beam and the method further comprises:
detecting electrons of the first charged particle beam having passed the second specimen.

5. The method of claim 1, wherein the further processing is continued until the second specimen is transparent for electrons.

6. The method of claim 1, further comprising:
lifting the second specimen out of the first specimen using a micromanipulator.

7. The method of claim 1, further comprising:
observing the cutting-out of the second specimen using the first charged particle beam.

8. The method of claim 7, further comprising:
before fastening the second specimen to the second receiving surface, rotating the carrier element in a manner that a surface normal of the second receiving surface is oriented substantially parallel to the first optical axis of the first charged particle column.

9. The method of claim 1, further comprising:
observing the fastening of the second specimen to the second receiving surface using the first charged particle beam.

10. A charged particle beam system, comprising:
a first charged particle beam column having a first optical axis and providing a first charged particle beam;
a second charged particle beam column having a second optical axis and providing a second charged particle beam, wherein the second optical axis is inclined relative to the first optical axis by an angle;
a carrier element which is rotatable around a first axis and around a second axis, wherein the first axis is perpendicular to the second axis; and
a first receiving element and a second receiving element, wherein the first and second receiving elements are situated on the carrier element in such a way that a movement of the carrier element always causes a movement of the first receiving element and the second receiving element around the same axis, wherein the first receiving element has a first receiving surface which lies in a first plane and the second receiving element has a second receiving surface which lies in a second plane, and wherein the first plane is inclined relative to the second plane by the angle under which the second optical axis is inclined relative to the first optical axis.

11. A charged particle beam system, comprising:
a first charged particle beam column having a first optical axis and providing a first charged particle beam;
a second charged particle beam column having a second optical axis and providing a second charged particle beam, wherein the second optical axis is inclined relative to the first optical axis;
a carrier element which is rotatable around a first axis and around a second axis, wherein the first axis is perpendicular to the second axis; and
a first receiving element and a second receiving element, wherein the first and second receiving elements are situated on the carrier element in such a way that a movement of the carrier element always causes a movement of the first receiving element and the second receiving element around the same axis, wherein the first receiving element has a first receiving surface which lies in a first plane and the second receiving element has a second receiving surface which lies in a second plane, and wherein the first plane is inclined relative to the second plane by an angle in the range of 10° to 90°.

* * * * *